(12) United States Patent
Kamei

(10) Patent No.: US 7,895,741 B2
(45) Date of Patent: Mar. 1, 2011

(54) METHOD OF PRODUCING A WIRED CIRCUIT BOARD

(75) Inventor: Katsutoshi Kamei, Osaka (JP)

(73) Assignee: Nitto Denko Corporation, Osaka (JP)

( * ) Notice: Subject to any disclaimer, the term of this patent is extended or adjusted under 35 U.S.C. 154(b) by 196 days.

(21) Appl. No.: 12/219,599

(22) Filed: Jul. 24, 2008

(65) Prior Publication Data

US 2009/0025217 A1 Jan. 29, 2009

Related U.S. Application Data

(60) Provisional application No. 60/935,320, filed on Aug. 6, 2007.

(30) Foreign Application Priority Data

Jul. 24, 2007 (JP) .................. 2007-192215

(51) Int. Cl.
*H05K 3/02* (2006.01)
*H01B 13/00* (2006.01)
(52) U.S. Cl. .................. 29/847; 29/831; 29/832; 29/840; 29/852; 29/866; 216/13
(58) Field of Classification Search .................. 29/847, 29/830, 831, 832, 848, 840, 852, 866; 360/245.8, 360/245.9, 246; 174/257, 256, 261, 250, 174/255, 258; 427/97; 156/644; 216/13, 38, 52
See application file for complete search history.

(56) References Cited

U.S. PATENT DOCUMENTS

| 4,894,271 A * | 1/1990 | Hani et al. ................. 428/137 |
| 5,377,406 A * | 1/1995 | Matsumoto et al. ............ 216/20 |
| 6,527,963 B1 * | 3/2003 | Yoshimura ..................... 216/13 |
| 6,739,048 B2 * | 5/2004 | Jones et al. ..................... 29/852 |
| 6,801,402 B1 * | 10/2004 | Subrahmanyam et al. 360/245.9 |
| 6,841,737 B2 * | 1/2005 | Komatsubara et al. ....... 174/250 |
| 7,182,606 B2 | 2/2007 | Ishii et al. |
| 7,319,573 B2 | 1/2008 | Nishiyama |
| 2005/0186332 A1 * | 8/2005 | Funada et al. ............... 427/96.1 |

FOREIGN PATENT DOCUMENTS

| JP | 2005-11387 | 1/2005 |
| JP | 2006-245220 | 9/2006 |
| JP | 2006-278734 | * 10/2006 |

* cited by examiner

*Primary Examiner* — Derris H Banks
*Assistant Examiner* — Tai Nguyen
(74) *Attorney, Agent, or Firm* — Jean C. Edwards, Esq.; Akerman Senterfitt LLP

(57) ABSTRACT

A method of producing a wired circuit board includes preparing a metal supporting board, forming a metal foil on the metal supporting board, forming an insulating layer on the metal foil to expose an unneeded portion of the metal foil, etching the unneeded portion using the insulating layer as an etching resist, and forming a plurality of wires on the insulating layer.

6 Claims, 7 Drawing Sheets

(a)

(b)

(c)

(d)

(e)

(f)

(g)

(h)

METHOD OF PRODUCING A WIRED CIRCUIT BOARD

CROSS REFERENCE TO RELATED APPLICATION

This application claims the benefit of U.S. Provisional Application No. 60/935,320, filed Aug. 6, 2007, and claims priority from Japanese Patent Application No. 2007-192215, filed Jul. 24, 2007, the contents of which are herein incorporated by reference in their entirety.

BACKGROUND OF THE INVENTION

1. Field of the Invention

The present invention relates to a method of producing a wired circuit board. More particularly, the present invention relates to a method of producing a wired circuit board such as a suspension board with circuit.

2. Description of the Related Art

A hard disk drive is equipped with a suspension board with circuit on which a magnetic head is mounted. In a typical suspension board with circuit, an insulating layer made of a resin and a conductive pattern made of copper are formed in this order on a metal supporting board made of stainless steel.

In such a suspension board with circuit, since a metal supporting board is formed of stainless steel, a transmission loss in a conductive pattern is increased.

To reduce the transmission loss, it is proposed that an insulating layer is formed on a suspension made of stainless steel, a lower conductor made of copper or a copper alloy is formed on the insulating layer, and an insulating layer, and conductors of a record side and a reproduction side are formed in this order on the lower conductor (see, e.g., Japanese Unexamined Patent No. 2005-11387).

A suspension board with circuit is also proposed which includes a metal supporting board, a metal thin film formed on the metal supporting board, a metal foil formed on the metal thin film, an insulating base layer formed on the metal foil, and a conductive pattern formed on the insulating base layer (see, e.g., Japanese Unexamined Patent No. 2006-245220).

The suspension board with circuit is produced as follows. That is, a metal supporting board is prepared first, and a metal thin film is formed on an entire surface of the metal supporting board by sputtering. Then, a resist is formed on the surface of the metal thin film in a pattern reverse to the pattern of a metal foil. Then, using the resist as a plating resist, the metal foil is formed on the surface of the metal thin film exposed from the resist by electrolytic plating. Thereafter, the resist and the portion of the metal thin film where the resist is formed are removed. Subsequently, a solution (varnish) of a synthetic resin is coated on the respective surfaces of the metal foil and the metal supporting board, dried, and cured to form the insulating base layer. Then, the conductive pattern is formed on the surface of the insulating base layer.

SUMMARY OF THE INVENTION

In the producing method described above, the varnish is coated on the respective surfaces of the metal foil and the metal supporting board after the formation of the metal foil as the pattern. The varnish is then dried and cured to form the insulating base layer. At this time, the problem arises that air bubbles are likely to be accumulated in the varnish coated on the side surfaces of the metal foil due to the level difference between the metal supporting board and the metal foil.

Moreover, to form the insulating base layer on the surface of the metal foil in the producing method described above, it is necessary to coat the varnish with a thickness at least larger than the thickness of the metal foil on the metal supporting board. As a result, the problem also arises that the insulating base layer is formed thick, and cost increases.

Further, the producing method described above includes a large number of steps, such as the step of forming the plating resist and the step of removing the plating resist. Accordingly, there are limits to an improvement in production efficiency, and to a reduction in production cost.

It is therefore an object of the present invention to provide a producing method of a wired circuit board which allows the formation of a thin insulating layer, while preventing the accumulation of air bubbles in the insulating layer, and further allows an improvement in production efficiency and a reduction in production cost by reducing the number of production steps.

A producing method of a wired circuit board according to the present invention includes preparing a metal supporting board, forming a metal foil on the metal supporting board, forming an insulating layer on the metal foil to expose an unneeded portion of the metal foil, etching the unneeded portion using the insulating layer as an etching resist, and forming a plurality of wires on the insulating layer.

In the producing method of the wired circuit board according to the present invention, it is preferable that, in the step of forming the insulating layer, the insulating layer is formed continuously so as to correspond to all the wires in a direction perpendicular to direction in which the wires extend.

In the producing method of the wired circuit board according to the present invention, it is preferable that, in the step of forming the insulating layer, a plurality of the insulating layers are formed in mutually spaced-apart relation so as to correspond to the individual wires in a direction perpendicular to a direction in which the wires extend.

In the producing method of the wired circuit board according to the present invention, it is preferable that the plurality of wires are provided as a plurality of pairs of the wires, and a plurality of the insulating layers are formed in mutually spaced-apart relation so as to correspond to the individual pairs of wires in a direction perpendicular to a direction in which the wires extend.

In the producing method of the wired circuit board according to the present invention, it is preferable that the wired circuit board is a suspension board with circuit.

In accordance with the producing method of the wired circuit board according to the present invention, the insulating layer is formed on the metal foil, and then the unneeded portion of the metal foil is etched using the insulating layer as the etching resist. Thus, a varnish is not coated on the respective surfaces of the metal foil and the metal supporting board which have a level difference therebetween. Therefore, it is possible to prevent the accumulation of air bubbles in the insulating layer.

In addition, in accordance with the producing method of the wired circuit board according to the present invention, the insulating layer is formed first on the metal foil, and then the unneeded portion of the metal foil is etched. This allows the formation of the insulating base layer with any thickness irrespective of the thickness of the metal foil. As a result, the insulating base layer can be formed thin, and cost can be reduced.

Further, in accordance with the producing method of the wired circuit board according to the present invention, the unneeded portion of the metal foil is etched using the insulating layer as the etching resist. As a result, there are no such steps as the step of forming a plating resist and the step of removing the plating resist. Therefore, it is possible to reduce the number of production steps, improve production efficiency, and reduce production cost.

DETAILED DESCRIPTION OF THE INVENTION

Figure 1:
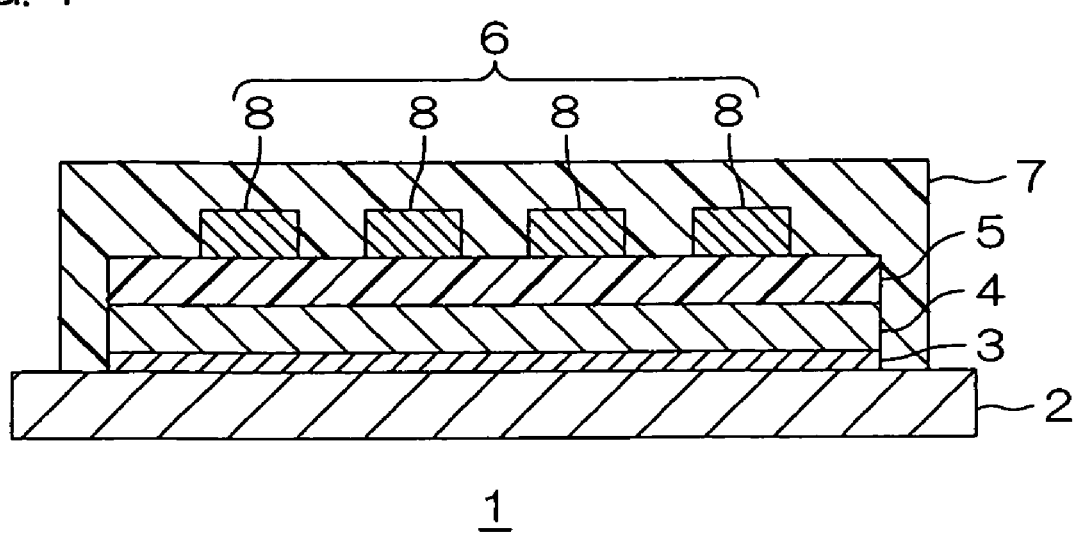
FIG. 1 is a cross-sectional view showing a principal portion of an embodiment of a suspension board with circuit produced by a producing method of a wired circuit board according to the present invention.

FIG. 1 is a cross-sectional view showing a principal portion of an embodiment of a suspension board with circuit produced by a producing method of a wired circuit board according to the present invention. More specially, FIG. 1 is a cross-sectional view showing the principal portion of a suspension board with circuit 1 in a direction perpendicular to the longitudinal direction thereof (hereinafter referred to as a widthwise direction).

The suspension board with circuit 1 has a conductive pattern 6 integrally formed on a metal supporting board 2 extending in the longitudinal direction. The conductive pattern 6 includes a plurality of wires 8 extending along the longitudinal direction of the metal supporting board 2, and terminal portions (not shown) provided on the both longitudinal end portions of the individual wires 8.

The suspension board with circuit 1 is mounted on a hard disk drive. A magnetic head is mounted on one longitudinal end portion of the metal supporting board 2 to be electrically connected to one of the terminal portions of the conductive pattern 6. A read/write board is electrically connected to the other terminal portion of the conductive pattern 6. A read signal read from a hard disk by the magnetic head is transmitted from the magnetic head to the read/write board via the one terminal portion, the wires 8, and the other terminal portion. A write signal to be written to the hard disk from the read/write board is transmitted from the read/write board to the magnetic head via the other terminal portion, the wires 8, and the one terminal portion, and written to the hard disk by the magnetic head.

In FIG. 1, the suspension board with circuit 1 includes the metal supporting board 2, a metal thin film 3 formed on the metal supporting board 2, a metal foil 4 formed on the metal thin film 3, an insulating base layer 5 as an insulating layer formed on the metal foil 4, the conductive pattern 6 formed on the insulating base layer 5, and an insulating cover layer 7 formed on the metal supporting board 2 so as to cover the metal thin film 3, the metal foil 4, the insulating base layer 5, and the conductive pattern 6.

The metal supporting board 2 is formed of a metal foil or a metal thin plate in a flat plate shape. The metal supporting board 2 is formed in the outer shape of the suspension board with circuit 1 to extend in the longitudinal direction. Examples of a metal for forming the metal supporting board 2 include stainless steel, copper, a copper alloy, and a 42-alloy. Preferably, stainless steel or a copper alloy is used. The thickness of the metal supporting board 2 is in the range of, e.g., 10 to 50 μm, or preferably 15 to 25 μm.

The metal thin film 3 is formed in a pattern on the surface of the metal supporting board 2 so as to overlap the metal foil 4 when viewed in plan view (in other words, when the metal thin film 3 is projected in the thickness directions thereof). Examples of a metal for forming the metal thin film 3 include chromium, gold, silver, platinum, nickel, titanium, silicon, manganese, zirconium, an alloy thereof, and an oxide thereof.

The thickness of the metal thin film 3 is in the range of, e.g., 0.01 to 1 μm, or preferably 0.1 to 1 μm.

In consideration of the adhesion with the metal supporting board 2 and the metal foil 4, the metal thin film 3 can also be formed of multiple layers by, e.g., forming a first metal thin film 3 made of a metal having high adhesion to the metal supporting board 2 on the surface of the metal supporting board 2, and then laminating a second metal thin film 3 made of a metal having high adhesion to the metal foil 4 or the like on the surface of the first metal thin film 3.

The metal foil 4 is formed in a pattern on the surface of the metal thin film 3 so as to overlap the insulating base layer 5 when viewed in plan view. Examples of a metal used to form the metal foil 4 include copper, silver, nickel, gold, a solder, or an alloy thereof. Preferably, copper is used. The thickness of the metal foil 4 is in the range of, e.g., 2 to 5 μm, or preferably 2 to 4 μm.

The insulating base layer 5 is formed in a pattern on the surface of the metal foil 4 so as to overlap at least the conductive pattern 6 when viewed in plan view. Specifically, the insulating base layer 5 is formed continuously in the widthwise direction so as to correspond to all the wires 8. Examples of an insulator used to form the insulating base layer 5 include synthetic resins such as polyimide, polyether nitrile, polyether sulfone, polyethylene terephthalate, polyethylene naphthalate, and polyvinyl chloride. Among these synthetic resins, a photosensitive synthetic resin is used preferably, or more preferably photosensitive polyimide is used. The thickness of the insulating base layer 5 is in the range of, e.g., not more than 50 μm, or more preferably 5 to 10 μm.

As described above, the conductive pattern 6 includes the plurality of wires 8 and the terminal portions (not shown). The plurality of (four) wires 8 are provided on the surface of the insulating base layer 5 in widthwise mutually spaced-apart relation so as to overlap the metal foil 4 and the insulating base layer 5 when viewed in plan view.

Among the plurality of wires 8, two adjacent ones are provided as a pair on one widthwise side to serve as read signal wires for transmitting the read signal mentioned above. On the other hand, the other two adjacent wires 8 are provided as a pair on the other widthwise side to serve as write signal wires for transmitting the write signal mentioned above.

Each of the wires 8 extends along the longitudinal direction of the metal supporting board 2 to be connected to the terminal portions on the both longitudinal end portions thereof. The width of the wire 8 is in the range of, e.g., 10 to 100 μm, or preferably 20 to 50 μm. The spacing between the individual wires 8 is in the range of, e.g., 15 to 100 μm, or preferably 20 to 50 μm. The thickness of the wire 8 is in the range of, e.g., 5 to 20 μm, or preferably 7 to 15 μm.

Examples of a conductor used to form the conductive pattern 6 include copper, nickel, gold, a solder, or an alloy thereof. Among them, copper is preferably used.

The insulating cover layer 7 is formed on the surface of the metal supporting board 2 so as to cover the metal thin film 3, the metal foil 4, the insulating base layer 5, and the conductive pattern 6. Specifically, the insulating cover layer 7 is formed on the surface of the metal supporting board 2 including the metal thin film 3, the metal foil 4, the insulating base layer 5, and the conductive pattern 6 when viewed in plan view.

The insulating cover layer 7 is formed with openings (not shown) for exposing both the terminal portions. The thickness of the insulating cover layer 7 is in the range of, e.g., 2 to 10 μm, or preferably 3 to 6 μm. As an insulator for forming the insulating cover layer 7, the same insulator as used to form the insulating base layer 5 mentioned above is used.

Figure 2:
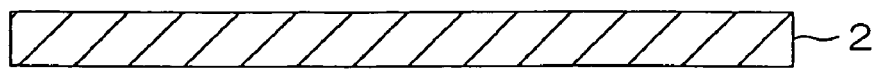
FIG. 2 is a production process view showing the producing method of the suspension board with circuit shown in FIG. 1, (a) showing the step of preparing a metal supporting board, (b) showing the step of forming a metal thin film over an entire surface of the metal supporting board, (c) showing the step of forming a metal foil on the entire surface of the metal thin film, (d) showing the step of forming a coating as a pattern on the entire surface of the metal foil, and (e) showing the step of curing the coating to form an insulating base layer 5.
Figure 2:
Figure 2:
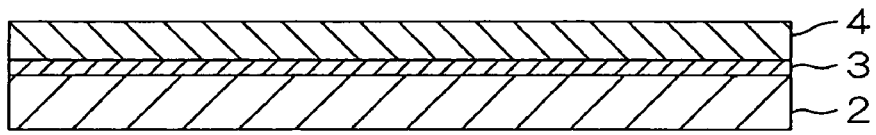
Figure 2:
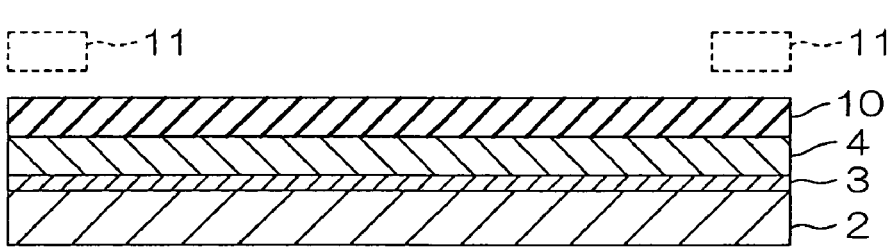
Figure 2:
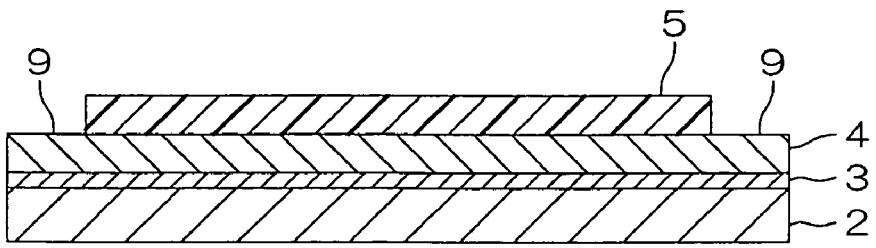
Figure 3:
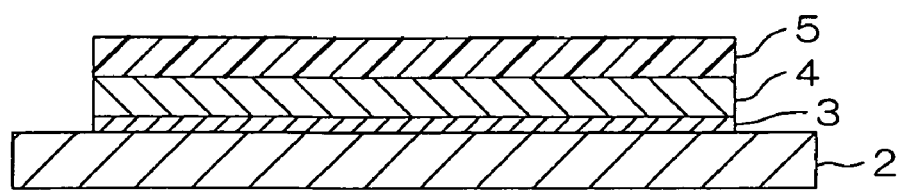
FIG. 3 is a production process view showing the producing method of the suspension board with circuit shown in FIG. 1, subsequently to FIG. 2, (f) showing the step of etching unneeded portions exposed from the insulating base layer using the insulating base layer as an etching resist, (g) showing the step of forming a conductive pattern on the surface of the insulating base layer, and (h) showing the step of forming an insulating cover layer on the surface of the metal supporting board so as to cover the metal thin film, the metal foil, the insulating base layer, and the conductive pattern.
Figure 3:
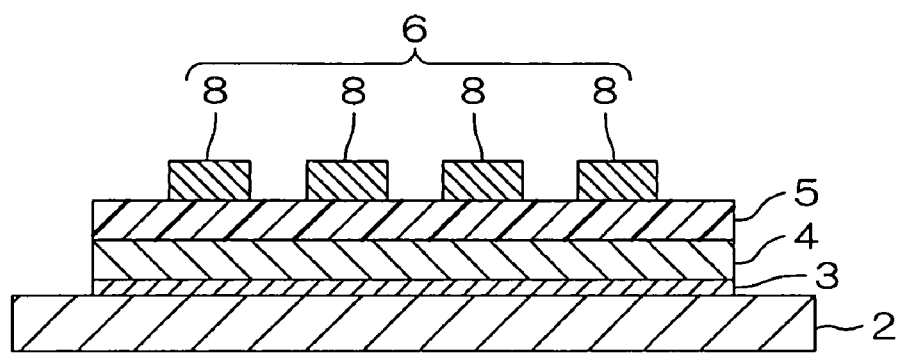
Figure 3:
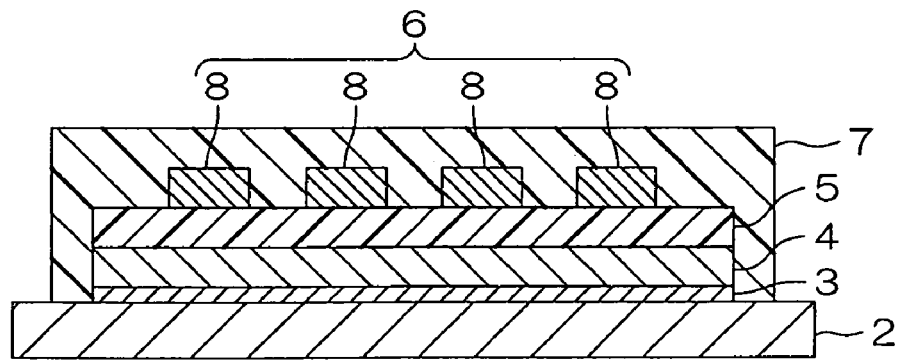

Next, a description is given to a producing method of the suspension board with circuit with reference to FIGS. 2 and 3.

First, as shown in FIG. 2(a), the metal supporting board 2 is prepared in the method.

Next, as shown in FIG. 2(b), the metal thin film 3 is formed on the entire surface of the metal supporting board 2 by sputtering or plating (electrolytic plating or electroless plating).

Then, as shown in FIG. 2(c), the metal foil 4 is formed on the entire surface of the metal thin film 3 by sputtering or plating (electrolytic plating or electroless plating).

Thereafter, as shown in FIGS. 2(d) and 2(e), the insulating base layer 5 is formed as the pattern on the surface of the metal foil 4 so as to expose unneeded portions 9 (portions to be removed by etching) of the metal foil 4.

Specifically, as shown in FIG. 2(d), a solution of a photosensitive synthetic resin (e.g., a varnish of a photosensitive polyamic acid resin) is coated first on the entire surface of the metal foil 4, and then dried to form a coating 10. Then, the coating 10 is exposed to light via a photomask 11, and subsequently developed to be formed as the pattern.

In FIG. 2(d), the coating 10 is formed as the pattern by disposing the photomask 11 in opposing relation to the unneeded portions 9 in a negative image, i.e., in the exposure to light, and dissolving an unexposed portion in the development. However, it is also possible to form the coating 10 as the pattern by disposing the photomask 11 in opposing relation to a portion other than the unneeded portions 9 (viz. portion to be left as the metal foil 4) in a positive image, i.e., in the exposure to light, and dissolving an exposed portion in the development.

Then, as shown in FIG. 2(e), the coating 10 is heated and cured as necessary to form the insulating base layer 5 made of a synthetic resin as the pattern.

The formation of the insulating base layer 5 is not limited to the method described above. For example, it is also possible to preliminarily form a synthetic resin into a film as the pattern, and adhesively bond the film to the surface of the metal foil 4 via an adhesive layer.

Next, as shown in FIG. 3(f), the unneeded portions 9 exposed from the insulating base layer 5 are etched using the insulating base layer 5 as an etching resist. To etch the unneeded portions 9, a known method using an etchant, such as a dipping method or a spraying method (wet etching method), is used. By the etching, the metal thin film 3 corresponding to the etched portions of the metal foil 4 is also etched. Therefore, by the etching, the metal thin film 3, the metal foil 4, and the insulating base layer 5 are each formed into the same shape when viewed in plan view.

Then, as shown in FIG. 3(g), the conductive pattern 6 is formed on the surface of the insulating base layer 5. The conductive pattern 6 is formed by a patterning method such as, e.g., an additive method or a subtractive method. Preferably, the conductive pattern 6 is formed by the additive method.

That is, in the additive method, a metal thin film (seed film) is first formed on the surface of the insulating base layer 5 and on the surface of the metal supporting board 2 exposed from the insulating base layer 5 by sputtering, plating (electrolytic plating or electroless plating), or the like. Then, a dry film resist is laminated on the surface of the metal thin film, exposed to light, and developed to form a plating resist in a pattern reverse to the conductive pattern 6. The conductive pattern 6 is formed by electrolytic plating on the surface of the metal thin film exposed from the plating resist. Thereafter, the plating resist and the portion of the metal thin film where the plating resist is formed are removed by etching or the like.

In this manner, the conductive pattern 6 is formed as a pattern including the plurality of wires 8 and the terminal portions.

Thereafter, as shown in FIG. 3(h), the insulating cover layer 7 is formed on the surface of the metal supporting board 2 so as to cover the metal thin film 3, the metal foil 4, the insulating base layer 5, and the conductive pattern 6.

Specifically, a solution of a photosensitive synthetic resin (e.g., a varnish of a photosensitive polyamic acid resin) is coated first on the surfaces of the wires 8, on the surface of the insulating base layer 5 exposed from the wires 8, and on the surface of the metal supporting board 2 exposed from the insulating base layer 5, and then dried to form a coating. Then, the coating is exposed to light via a photomask, and subsequently developed to be formed as a pattern exposing the terminal portions.

Thereafter, the coating is heated and cured as necessary to form the insulating cover layer 7 made of a synthetic resin as a pattern.

By thus forming the insulating cover layer 7, not only the wires 8 can be covered with the insulating cover layer 7, but also the surface (upper surface) and the side surfaces of the insulating base layer 5, the side surfaces of the metal foil 4, and the side surfaces of the metal thin film 3 can be covered with the insulating cover layer 7. As a result, it is possible to effectively prevent corrosion from the side surfaces of the metal foil 4 and the metal thin film 3.

The insulating cover layer 7 can also be formed with openings for exposing the terminal portions by coating a solution (varnish) of a non-photosensitive synthetic resin in the same manner as described above, curing the solution by drying and heating, and then performing a perforation process using a laser or by punching.

In this manner, the suspension board with circuit 1 is obtained.

In accordance with the producing method of the suspension board with circuit 1 described above, the insulating base layer 5 is formed as the pattern on the surface of the metal foil 4 so as to expose the unneeded portions 9 of the metal foil 4. Thus, the insulating base layer 5 is formed without coating of a varnish on the surfaces of the metal foil 4 and the metal supporting board 2 having a level difference therebetween. Therefore, it is possible to prevent the accumulation of air bubbles in the insulating base layer 5.

In accordance with the producing method of the suspension board with circuit 1 described above, the insulating base layer 5 is formed first on the surface of the metal foil 4, and then the unneeded portions 9 of the metal foil 4 are etched. This allows the formation of the insulating base layer 5 with any thickness irrespective of the thickness of the metal foil 4. As a result, the insulating base layer 5 can be formed thin, and cost can be reduced.

Further, in accordance with the producing method of the suspension board with circuit 1 described above, the unneeded portions 9 of the metal foil 4 are etched using the insulating base layer 5 as an etching resist. As a result, there are no such steps as the step of forming a plating resist and the step of removing the plating resist. Therefore, it is possible to reduce the number of production steps, improve production efficiency, and reduce production cost.

In the description given above, the metal thin film 3, the metal foil 4, and the insulating base layer 5 are formed continuously in the widthwise direction on the metal supporting board 2 so as to correspond to all the wires 8.

Figure 4:
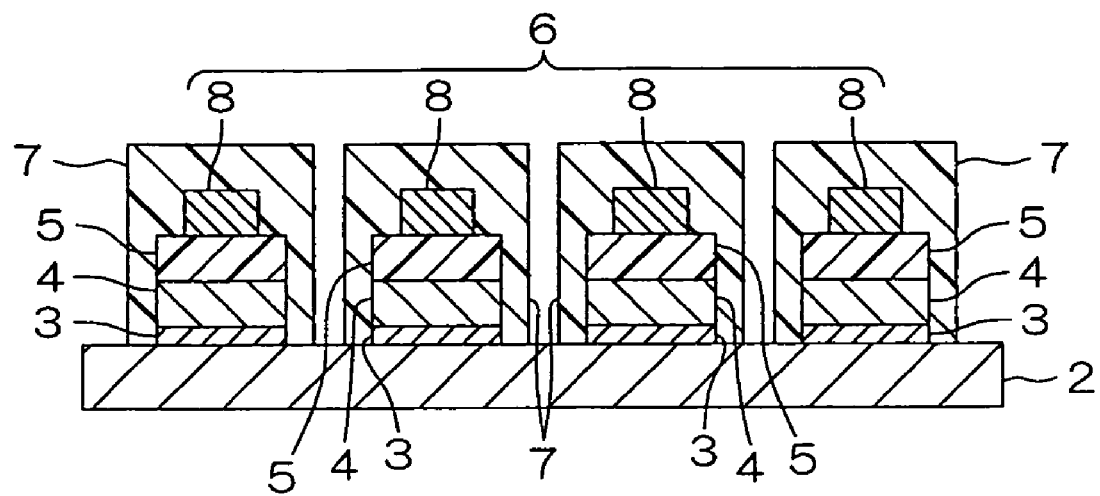
FIG. 4 is a cross-sectional view showing a principal portion of another embodiment (in which a plurality of the metal thin films, the metal foils, and the insulating base layers are each formed on the metal supporting board to correspond to individual wires) of the suspension board with circuit produced by the producing method of the wired circuit board according to the present invention.

However, it is also possible to, e.g., form a plurality of the metal thin films 3, the metal foils 4, and the insulating base layer 5 on the metal supporting board 2 in widthwise spaced-apart relation so as to correspond to the individual wires 8, as shown in FIG. 4. In FIG. 4, the same members as described above are provided with the same reference numerals, and a description thereof is omitted.

In FIG. 4, the metal thin films 3, the metal foils 4, and the insulating base layers 5 are formed on the metal supporting board 2 in widthwise divided relation so as to overlap the individual wires 8 when viewed in plan view.

The insulating cover layers 7 are also formed on the metal supporting board 2 in widthwise divided relation so as to individually cover the metal thin films 3, the metal foils 4, and the insulating base layers 5 formed to correspond to the individual wires 8.

The width (widthwise length) of each insulating base layer 5 is in the range of, e.g., 0.01 to 5 mm, or preferably 0.05 to 1.5 mm. The spacing between the individual insulating base layers 5 is in the range of, e.g., 0.01 to 5 mm, or preferably 0.1 to 2 mm.

Figure 5:
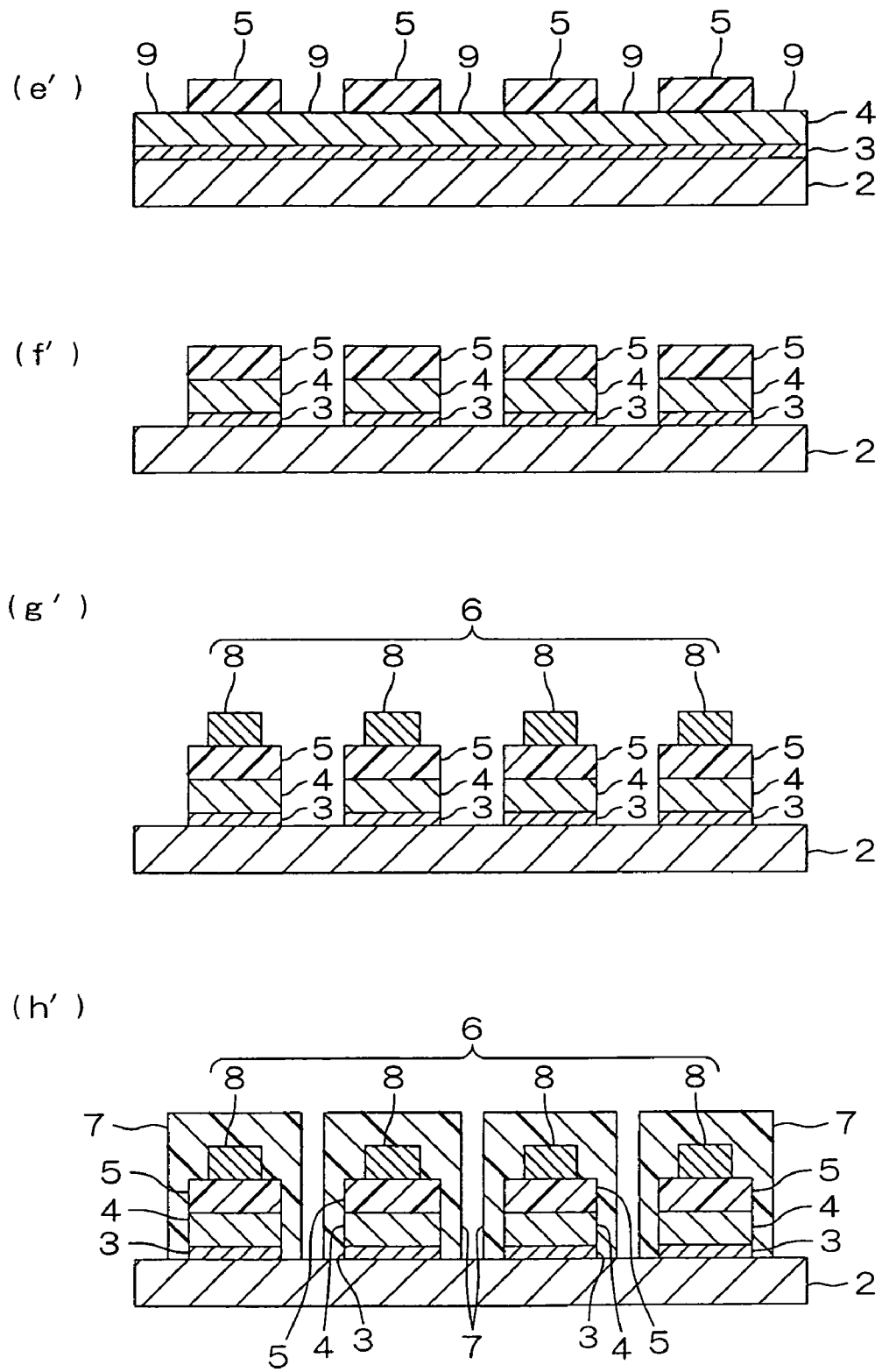
FIG. 5 is a production process view showing a producing method of the suspension board with circuit shown in FIG. 4, (e') showing the step of forming the insulating base layers in widthwise spaced-apart relation to correspond to the individual wires, (f') showing the step of etching unneeded portions exposed from the insulating base layers using the insulating base layers as an etching resist, (g') showing the step of forming the conductive pattern on the surfaces of the insulating base layers, and (h') showing the step of forming the insulating cover layers on the metal supporting board so as to cover each of the divided metal thin films, metal foils, and insulating base layers, and the conductive pattern.

Next, a description is given to a producing method of the suspension board with circuit shown in FIG. 4 with reference to FIG. 5.

First, in the method, the metal thin film 3 is formed on the entire surface of the metal supporting board 2, and the metal foil 4 is formed on the entire surface of the metal thin film 3 in the same manner as described above.

Next, as shown in FIG. 5(e'), the insulating base layer 5 is formed as a pattern on the surface of the metal foil 4 so as to expose the unneeded portions 9 (portions to be removed by etching) of the metal foil 4. Specifically, the plurality of (four) insulating base layers 5 are formed in widthwise spaced-apart relation to correspond to the individual wires 8 by the same method as described above.

Next, as shown in FIG. 5(f'), the unneeded portions 9 of the metal foil 4 exposed from the insulating base layers 5, and the metal thin film 3 corresponding to the portions to be etched in the metal foil 4 are etched using the insulating base layers 5 as an etching resist. By the etching, the metal thin films 3, the metal foils 4, and the insulating base layers 5 are each formed into the same shape when viewed in plan view. That is, the metal thin films 3, the metal foils 4, and the insulating base layers 5 are formed in widthwise divided relation to correspond to the individual wires 8.

Then, as shown in FIG. 5(g'), the conductive pattern 6 is formed so as to individually dispose the wires 8 on the respective surfaces of the divided insulating base layers 5.

Thereafter, as shown in FIG. 5(h'), the insulating cover layers 8 are formed on the surface of the metal supporting board 2 so as to individually cover each of the divided metal thin films 3, metal foils 4, and insulating base layers 5, and the conductive pattern 6.

In this manner, the suspension board with circuit 1 is obtained.

In the suspension board with circuit 1 shown in FIG. 4, the metal thin films 3, the metal foils 4, and the insulating base layers 5 are formed to correspond to the individual wires 8. Thus, in accordance with the method described above, the insulating base layers 5 are formed without coating of a varnish on each of the metal foils 4 corresponding to the individual wires 8. As a result, it is possible to prevent the accumulation of air bubbles in the insulating base layers 5 formed to correspond to the individual wires 8. Therefore, the method described above is effective in the production of the suspension board with circuit 1 shown in FIG. 4, and particularly effective in the production of the suspension board with circuit 1 shown in FIG. 6, which is described next.

Figure 6:
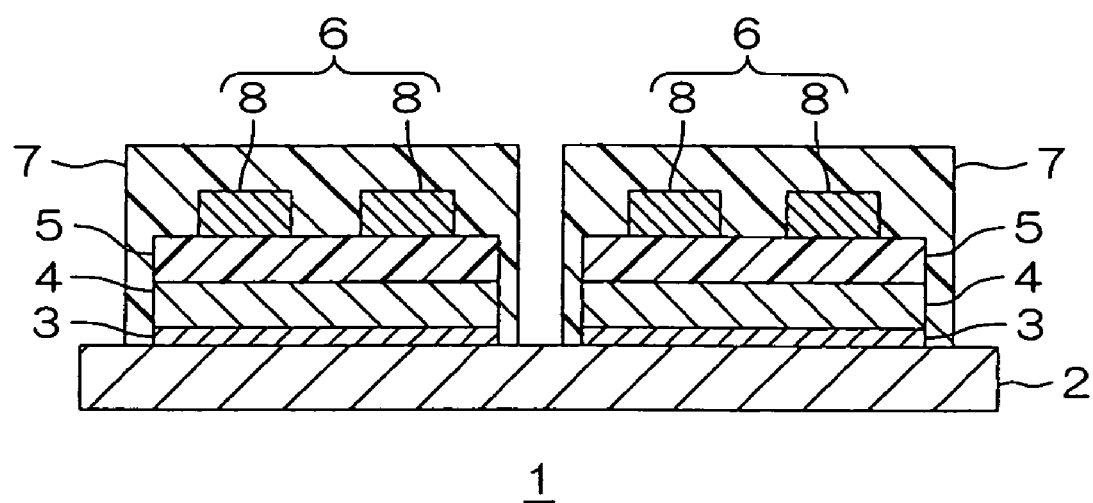
FIG. 6 is a cross-sectional view showing a principal portion of still another embodiment (in which a plurality of the metal thin films, the metal foils, and the insulating base layers are each formed on the metal supporting board to correspond to the individual pairs of wires) of the suspension board with circuit produced by the producing method of the wired circuit board according to the present invention.

As shown in FIG. 6, it is also possible to provide a plurality of the metal thin films 3, the metal foils 4, and the insulating base layer 5 in mutually spaced-apart relation on the metal supporting board 2 so as to correspond to the individual pairs of wires 8. In FIG. 6, the same members as described above are provided with the same reference numerals, and a description thereof is omitted.

In FIG. 6, the metal thin films 3, the metal foils 4, and the insulating base layers 5 are formed in widthwise divided relation on the metal supporting board 2 so as to overlap the individual pairs of wires 8 when viewed in plan view. Specifically, the metal thin film 3, the metal foil 4, and the insulating base layer 5 on one widthwise side are provided so as to overlap the pair of two wires 8 provided as the read signal wires on one widthwise side when viewed in plan view. On the other hand, the metal thin film 3, the metal foil 4, and the insulating base layer 5 on the other widthwise side are provided so as to overlap the pair of two wires 8 provided as the write signal wires on the other widthwise side when viewed in plan view.

The insulating cover layers 7 are also formed in widthwise divided relation on the metal supporting board 2 so as to individually cover the metal thin films 3, the metal foils 4, and the insulating cover layers 5 which are formed to correspond to the individual pairs of wires 8.

The width (widthwise length) of the insulating base layer 5 is in the range of, e.g., 0.02 to 5 mm, or preferably 0.05 to 1.5 mm. The spacing between the individual insulating base layers 5 is in the range of, e.g., 0.01 to 5 mm, or preferably 0.1 to 2 mm.

Figure 7:
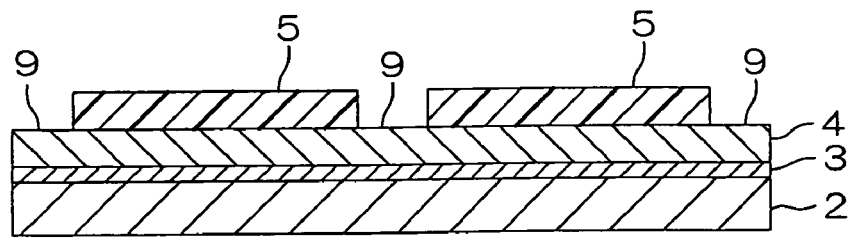
FIG. 7 is a production process view showing a producing method of the suspension board with circuit shown in FIG. 6, (e") showing the step of forming the insulating base layers in widthwise spaced-apart relation to correspond to the individual pairs of wires, (f") showing the step of etching unneeded portions exposed from the insulating base layers using the insulating base layers as an etching resist, (g") showing the step of forming the conductive patterns on the surfaces of the insulating base layers, and (h") showing the step of forming the insulating cover layers on the metal supporting board so as to cover each of the divided metal thin films, metal foils, insulating base layers, and conductive patterns.
Figure 7:
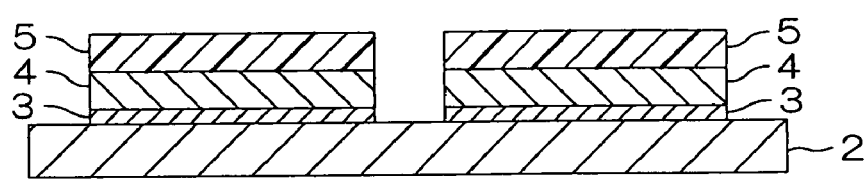
Figure 7:
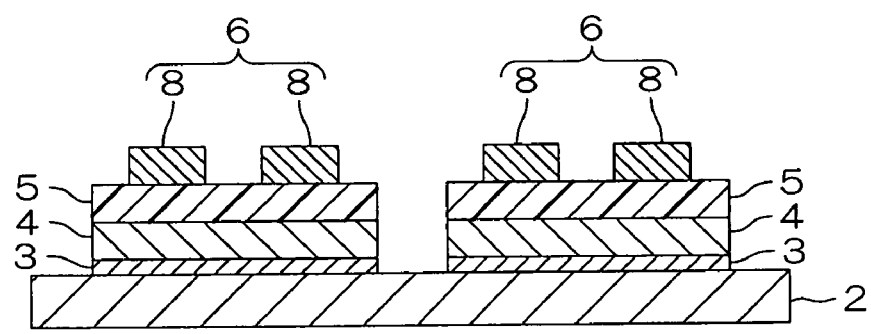
Figure 7:
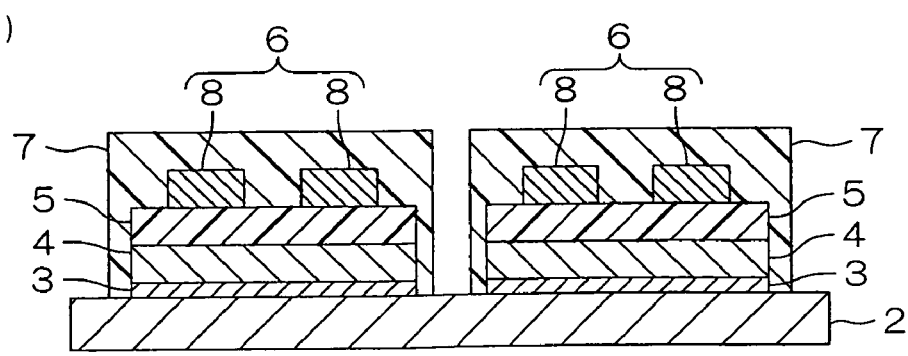

Next, a description is given to a producing method of the suspension board with circuit shown in FIG. 6 with reference to FIG. 7.

First, in the method, the metal thin film 3 is formed on the entire surface of the metal supporting board 2, and the metal foil 4 is formed on the entire surface of the metal thin film 3 in the same manner as described above.

Next, as shown in FIG. 7(e''), the insulating base layer 5 is formed as a pattern on the surface of the metal foil 4 so as to expose the unneeded portions 9 (portions to be removed by etching) of the metal foil 4. Specifically, the plurality of (two) insulating base layers 5 are formed in widthwise spaced-apart relation to correspond to the individual pairs of wires 8 by the same method as described above.

Next, as shown in FIG. 7(f''), the unneeded portions 9 of the metal foil 4 exposed from the insulating base layers 5, and the metal thin film 3 corresponding to the portions to be etched in the metal foil 4 are etched using the insulating base layers 5 as an etching resist. By the etching, the metal thin films 3, the metal foils 4, and the insulating base layers 5 are each formed into the same shape when viewed in plan view. That is, the metal thin films 3, the metal foils 4, and the insulating base layer 5 are formed in widthwise divided relation to correspond to the individual pairs wires 8.

Then, as shown in FIG. 7(g''), the conductive patterns 6 are formed so as to individually dispose the pairs of wires 8 on the respective surfaces of the divided insulating base layers 5. Specifically, the pair of wires 8 are formed as the read signal wires on one widthwise side of the insulating base layer 5, while the pair of wires 8 are formed as the write signal wires on the other widthwise side of the insulating base layer 5.

Thereafter, as shown in FIG. 7(h''), the insulating cover layers 7 are formed on the surface of the metal supporting board 2 so as to individually cover each of the divided metal thin films 3, metal foils 4, insulating base layers 5, and conductive patterns 6.

In this manner, the suspension board with circuit 1 is obtained.

In the suspension board with circuit 1 shown in FIG. 6, the metal thin films 3, the metal foils 4, the insulating base layers 5, the conductive patterns 6, and the insulating cover layers 7 are formed so as to overlap the individual pairs of wires 8 (the pair of read signal wires and the pair of write signal wires) when viewed in plan view. Therefore, even when the read signal and the write signal are differential signals, a transmission loss in each of the wires 8 can be sufficiently reduced.

In the description given above, the metal thin film 3 is provided between the metal supporting board 2 and the metal foil 4 in order to improve the adhesion therebetween. However, the metal foil 4 can also be provided directly on the metal supporting board 2 depending on the application and purpose thereof.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A method of producing a wired circuit board, the method comprising:
    preparing a metal supporting board;
    forming a metal foil on the metal supporting board;
    forming an insulating layer on the metal foil to expose an unneeded portion of the metal foil;
    etching the unneeded portion using the insulating layer as an etching resist; and
    forming a plurality of wires on the insulating layer.

2. The method of producing the wired circuit board according to claim 1, wherein, in the step of forming the insulating layer, the insulating layer is formed continuously so as to correspond to all the wires in a direction perpendicular to a direction in which the wires extend.

3. The method of producing the wired circuit board according to claim 1, wherein, in the step of forming the insulating layer, a plurality of the insulating layers are formed in mutually spaced-apart relation so as to correspond to the individual wires in a direction perpendicular to a direction in which the wires extend.

4. The method of producing the wired circuit board according to claim 1, wherein the plurality of wires are provided as a plurality of pairs of the wires, and
    a plurality of the insulating layers are formed in mutually spaced-apart relation so as to correspond to the individual pairs of wires in a direction perpendicular to a direction in which the wires extend.

5. The method of producing the wired circuit board according to claim 1, wherein the wired circuit board is a suspension board with circuit.

6. The method of producing the wired circuit board according to claim 1, further comprising forming an insulating cover layer over the plurality of wires, an upper surface and side surfaces of the insulating layer, side surfaces of the metal foil, and so as to be in contact with a top surface of the metal supporting board.

* * * * *